(12) United States Patent
Abe

(10) Patent No.: US 12,292,238 B2
(45) Date of Patent: May 6, 2025

(54) HEAT DISSIPATION MEMBER

(71) Applicant: KYOCERA Corporation, Kyoto (JP)

(72) Inventor: Yuichi Abe, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 170 days.

(21) Appl. No.: 17/802,127

(22) PCT Filed: Feb. 25, 2021

(86) PCT No.: PCT/JP2021/007216
§ 371 (c)(1),
(2) Date: Aug. 24, 2022

(87) PCT Pub. No.: WO2021/172479
PCT Pub. Date: Sep. 2, 2021

(65) Prior Publication Data
US 2023/0080077 A1    Mar. 16, 2023

(30) Foreign Application Priority Data

Feb. 26, 2020 (JP) .................. 2020-031035
Feb. 26, 2020 (JP) .................. 2020-031049
Feb. 26, 2020 (JP) .................. 2020-031059

(51) Int. Cl.
*F28D 15/02* (2006.01)
*F28D 15/04* (2006.01)
(Continued)

(52) U.S. Cl.
CPC ......... *F28D 15/0233* (2013.01); *F28D 15/04* (2013.01); *H01L 23/427* (2013.01); *H05K 7/20* (2013.01)

(58) Field of Classification Search
CPC .... F28D 15/00; F28D 15/0233; F28D 15/046; F28F 13/185; F28F 13/187
See application file for complete search history.

(56) References Cited

U.S. PATENT DOCUMENTS 7,775,261 B2 *  8/2010  Valenzuela ......... F28D 15/0233
                                              165/104.21
8,534,348 B2 *  9/2013  Ohsawa ................ H01L 23/427
                                               29/890.032
(Continued)

FOREIGN PATENT DOCUMENTS

CN     108882644 A     11/2018
DE     10253457 B3 *    7/2004 ............. F28F 13/18
(Continued)

*Primary Examiner* — Jianying C Atkisson
*Assistant Examiner* — For K Ling
(74) *Attorney, Agent, or Firm* — Procopio, Cory, Hargreaves & Savitch LLP

(57) ABSTRACT

A heat dissipation member includes an intermediate member, a first member and a second member, each with a plate shape and made of a ceramic. The intermediate member includes a plurality of through holes each penetrating through a first surface and a second surface, of the intermediate member, located opposite to each other. The first member includes a first groove portion on a third surface of the first member, facing the first surface of the intermediate member. The second member includes a plurality of second grooves on a fourth surface facing the second surface of the intermediate member, and a heat source is arranged on a fifth surface located opposite to the fourth surface.

11 Claims, 16 Drawing Sheets

(51) Int. Cl.
*H01L 23/427* (2006.01)
*H05K 7/20* (2006.01)

(56) References Cited

U.S. PATENT DOCUMENTS

| | | | |
|---|---|---|---|
| 9,835,383 B1* | 12/2017 | Roper | F28D 15/046 |
| 11,013,145 B1* | 5/2021 | Naito | F28D 15/046 |
| 2007/0056711 A1 | 3/2007 | Ohsawa | |
| 2007/0227704 A1 | 10/2007 | Nagai et al. | |
| 2009/0020274 A1* | 1/2009 | Kawabata | H01L 23/427 |
| | | | 29/890.03 |
| 2009/0056917 A1* | 3/2009 | Majumdar | F28D 15/046 |
| | | | 165/104.26 |
| 2011/0308772 A1 | 12/2011 | Tsuruta et al. | |
| 2012/0211207 A1 | 8/2012 | Ohsawa et al. | |
| 2013/0133864 A1* | 5/2013 | Yang | H01L 33/642 |
| | | | 29/890.032 |
| 2013/0269913 A1* | 10/2013 | Ueda | F28D 15/0233 |
| | | | 165/104.26 |
| 2016/0091258 A1* | 3/2016 | Ahamed | F28D 15/0233 |
| | | | 165/104.26 |
| 2019/0186840 A1 | 6/2019 | Chiang | |
| 2019/0242654 A1* | 8/2019 | Machida | F28D 15/043 |
| 2019/0277574 A1* | 9/2019 | Kurashima | F28F 3/04 |
| 2019/0285357 A1* | 9/2019 | Sheng | F28D 15/0233 |
| 2020/0103175 A1* | 4/2020 | Ben-Menahem | F28D 15/046 |
| 2020/0103176 A1* | 4/2020 | Ben-Menahem | F28D 15/0266 |

FOREIGN PATENT DOCUMENTS

| | | |
|---|---|---|
| JP | 53-043464 U | 4/1978 |
| JP | 53-60755 A | 5/1978 |
| JP | 53-095146 U | 8/1978 |
| JP | 53-145471 U | 11/1978 |
| JP | 59-173690 A | 10/1984 |
| JP | 2007-212028 A | 8/2007 |
| JP | 2007-266153 A | 10/2007 |
| JP | 4112602 B1 | 7/2008 |
| JP | 2010-060243 A | 3/2010 |
| JP | 2011-038700 A | 2/2011 |
| JP | 2011-096994 A | 5/2011 |
| JP | 2015-094491 A | 5/2015 |
| JP | 2019-113232 A | 7/2019 |
| WO | 2007/113942 A1 | 10/2007 |

* cited by examiner

HEAT DISSIPATION MEMBER

CROSS-REFERENCE TO RELATED APPLICATION(S)

This application is a national stage application of International Application No. PCT/JP2021/007216, filed on Feb. 25, 2021, which designates the United States, the entire contents of which are herein incorporated by reference, and which is based upon and claims the benefit of priority to Japanese Patent Application No. 2020-031035, filed on Feb. 26, 2020, the entire contents of which are herein incorporated by reference, Japanese Patent Application No. 2020-031049, filed on Feb. 26, 2020, the entire contents of which are herein incorporated by reference, and Japanese Patent Application No. 2020-031059, filed on Feb. 26, 2020, the entire contents of which are herein incorporated by reference.

TECHNICAL FIELD

The present disclosure relates to a heat dissipation member.

BACKGROUND OF INVENTION

A known heat dissipation member (heat pipe) transfers heat from a high-temperature part to a low-temperature part by utilizing a cycle of evaporation and condensation of a working liquid.

Patent Document 1 discloses a metal heat pipe in which a plate-shaped intermediate member is interposed between a plate-shaped upper member and a plate-shaped lower member. Lattice-shaped grooves are formed on each of the lower surface of the upper member and the upper surface of the lower member. A plurality of vapor holes extending radially and a plurality of fine through holes generating capillary force are formed in the intermediate member.

In the heat pipe described in Patent Document 1, the vapor holes communicate with respective recessed portions of the upper member and the lower member to form a vapor diffusion channel for diffusing the vapor of the working liquid in a plane direction. Through holes communicate with each of the recessed portions of the upper member and the lower member, thereby forming a fine capillary channel for returning the working liquid in a direction orthogonal to the plane direction.

Patent Document 2 discloses a heat pipe made of a ceramic.

CITATION LIST

Patent Literature

Patent Document 1: JP 4112602 B
Patent Document 2: JP 59-173690 A

SUMMARY

Solution to Problem

In an aspect of the present disclosure, a heat dissipation member includes a plate-shaped intermediate member, a first member and a second member, made of a ceramic. The intermediate member includes a plurality of through holes each penetrating through the first surface and the second surface located opposite to each other. The first member includes a first groove portion on a third surface facing the first surface of the intermediate member. The second member includes a plurality of second groove portions on a fourth surface facing the second surface of the intermediate member, and a heat source is arranged on a fifth surface located opposite to the fourth surface. Each of the plurality of through holes decreases in diameter from the first surface side toward the second surface side.

DESCRIPTION OF EMBODIMENTS

Hereinafter, configurations (hereinafter referred to as "embodiments") for implementing the heat dissipation member according to the present disclosure will be described in detail with reference to the drawings. The present disclosure is not limited by the embodiments. The respective embodiments can be suitably combined to the extent that they do not contradict each other in terms of processing content. Note that, in the following embodiments, the same parts are denoted by the same reference signs, and duplicate descriptions are omitted.

In the following embodiments, expressions such as "constant", "orthogonal", "vertical" or "parallel" may be used, but these expressions need not be strictly "constant", "orthogonal", "vertical" or "parallel". That is, each of the expressions described above allows for deviations in, for example, manufacturing accuracy, installation accuracy, and the like.

In each of the drawings referred to below, for ease of explanation, an X-axis direction, a Y-axis direction, and a Z-axis direction that are orthogonal to each other may be defined to illustrate a rectangular coordinate system in which the Z-axis positive direction is the vertically upward direction.

Figure 1:
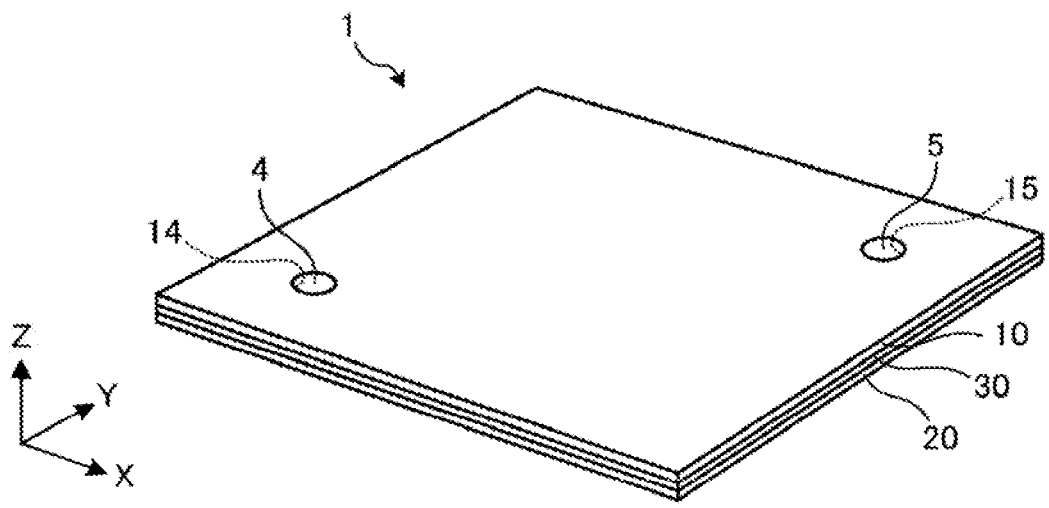
FIG. 1 is a perspective view of a heat dissipation member according to an embodiment.

First, the overall configuration of a heat dissipation member according to an embodiment will be described with reference to FIG. 1. FIG. 1 is a perspective view of a heat dissipation member according to an embodiment.

As illustrated in FIG. 1, a heat dissipation member 1 includes a first member 10, a second member 20, and an intermediate member 30. The first member 10, the second member 20, and the intermediate member 30 are all plate-shaped, and are layered such that the intermediate member 30 is sandwiched between the first member 10 and the second member 20.

The heat dissipation member 1 includes an internal space in which a working liquid is sealed. As the working liquid, for example, water, a hydrocarbon-based compound, an organic liquid such as ethanol or methanol, or a liquid such as ammonia may be used.

The first member 10 includes a working liquid injection hole 14 and a gas discharge hole 15. The working liquid is injected from the working liquid injection hole 14 into the internal space of the heat dissipation member 1. As the working liquid is injected, the gas existing in the internal space of the first member 10 is discharged from the gas discharge hole 15 to the outside. The working liquid injection hole 14 is located near one of the four corners of the first member 10, and the gas discharge hole 15 is located near another corner located diagonally opposite the working liquid injection hole 14.

The working liquid injection hole 14 and the gas discharge hole 15 are blocked by sealing members 4 and 5, respectively. The working liquid injection hole 14 and the gas discharge hole 15 are blocked, so that the internal space of the heat dissipation member 1 is closed and the working liquid is sealed in the internal space. This can withstand, for example, an increase in internal pressure during a high-temperature load, and enhance thermal diffusivity.

A ceramic of the same material as the first member 10, the second member 20 and the intermediate member 30 can be used for the sealing members 4 and 5, for example. A ceramic of a different material from the first member 10, the second member 20 and the intermediate member 30 can be used for the sealing members 4 and 5, for example. The sealing members 4 and 5 are not limited to a ceramic but may be a metal, a resin or the like. A respective adhesive may be interposed between the working liquid injection hole 14 and the sealing member 4, and between the gas discharge hole 15 and the sealing member 5. The adhesive may be, for example, a resin such as silicone or polyimide.

The working liquid is filled, for example, at a ratio of 10 vol % to 95 vol % with respect to the total volume of the internal space of the operating region 100. Preferably, the ratio is 30 vol % to 75 vol %. More preferably, the ratio is 40 vol % to 65 vol %. The remaining portion of the internal space of the heat dissipation member 1 other than the working liquid is in a vacuum state including some of the vaporized working liquid. Thus, since the vapor-liquid equilibrium can be maintained even under a high-temperature environment, dryout is less prone to occur, and since heat diffusion is efficiently performed even under a low-temperature environment, heat diffusivity can be enhanced in various temperature ranges.

The first member 10, the second member 20 and the intermediate member 30 are made of a ceramic. As the ceramic constituting the first member 10, the second member 20 and the intermediate member 30, for example, alumina ($Al_2O_3$), zirconia ($ZrO_2$), silicon carbide (SiC), silicon nitride ($Si_3N_4$), aluminum nitride (AlN), cordierite ($Mg_2Al_3(AlSi_5O_{18})$), silicon impregnated silicon carbide (SiSiC) or the like, can be used. The ceramic constituting the first member 10, the second member 20 and the intermediate member 30 may be a single crystal.

It is difficult to make the metal heat dissipation member rigid due to the material and construction method thereof, and it is difficult to make thin. The metal heat dissipation member has room for improvement in corrosion resistance because the part in contact with the working liquid is metal. On the other hand, in the heat dissipation member 1 according to an embodiment, since the first member 10, the second member 20, and the intermediate member 30, are all made of a ceramic, the heat dissipation member 1 can be made thinner and has excellent corrosion resistance as compared with a heat dissipation member made of a metal.

In the example illustrated in FIG. 1, the heat dissipation member 1 is installed with the first member 10 facing upward, but the installation state of the heat dissipation member 1 is not limited to the example illustrated in FIG. 1. For example, the heat dissipation member 1 may be installed with the first member 10 facing downward. The heat dissipation member 1 is not limited to the horizontal arrangement as illustrated in FIG. 1, but may be arranged vertically.

Figure 2:
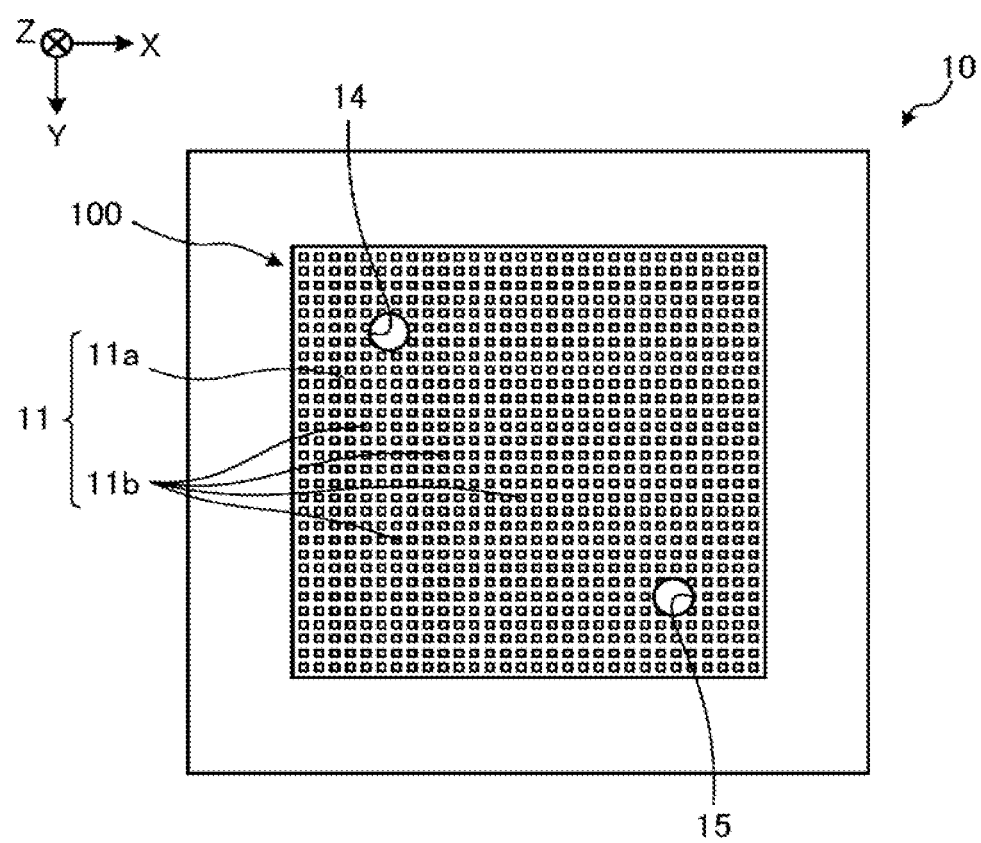
FIG. 2 is a view in which a first member according to an embodiment is viewed from a Z-axis negative direction side toward a Z-axis positive direction.

The configuration of the first member 10 will be described with reference to FIG. 2. FIG. 2 is a view in which a first member 10 according to an embodiment is viewed from the Z-axis negative direction side toward the Z-axis positive direction.

FIG. 2 illustrates a lower surface of the first member 10, specifically, a surface (third surface) facing the upper surface (first surface) of the intermediate member 30. As illustrated in FIG. 2, the first member 10 includes a lattice-shaped first groove portion 11 on the third surface.

The first groove portion 11 includes a first recessed portion 11a recessed with respect to the third surface and a plurality of first protruding portions 11b located within the first recessed portion 11a. The first recessed portion 11a is located at the center portion of the third surface, and its outline in plan view is, for example, a square. The plurality of first protruding portions 11b are arranged longitudinally (Y-axis direction) and laterally (X-axis direction) at intervals from each other within the first recessed portion 11a. The first recessed portion 11a and the plurality of first protruding portions 11b make the first groove portion 11 have a lattice shape.

Hereinafter, an area where the first groove portion 11 is located on the third surface of the first member 10, will be referred to as a "groove forming region 100". The working liquid injection hole 14 and the gas discharge hole 15 are located in the groove forming region 100.

Figure 3:
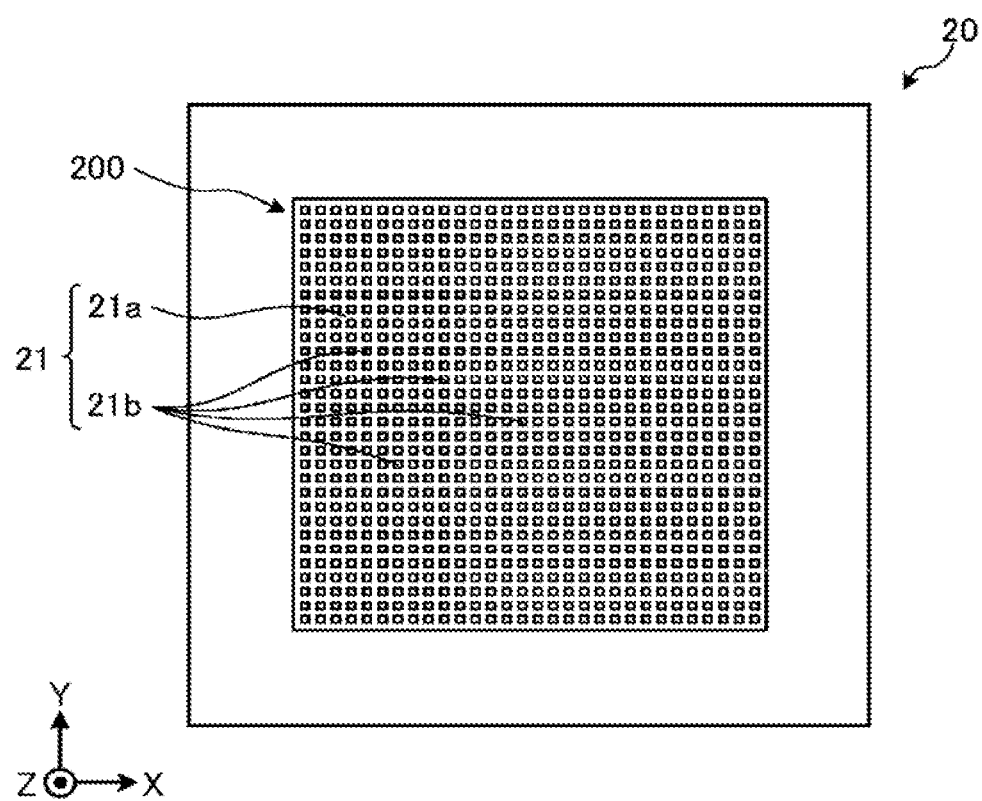
FIG. 3 is a view in which a second member according to an embodiment is viewed from a Z-axis positive direction side toward a Z-axis negative direction.

The configuration of the second member 20 will be described with reference to FIG. 3. FIG. 3 is a view in which the second member 20 according to an embodiment is viewed from the Z-axis positive direction side toward the Z-axis negative direction.

FIG. 3 illustrates the upper surface of the second member 20, specifically, the surface (the fourth surface) facing the lower surface (the second surface) of the intermediate member 30. As illustrated in FIG. 3, the second member 20 includes a lattice-shaped second groove portion 21 on the fourth surface.

The second groove portion 21 includes a second recessed portion 21a recessed with respect to the fourth surface and a plurality of second protruding portions 21b located within the second recessed portion 21a. The second recessed portion 21a is located at the center portion of the fourth surface, and its outline in plan view is, for example, a square. The plurality of second protruding portions 21b are arranged longitudinally (Y-axis direction) and laterally (X-axis direction) at intervals from each other within the second recessed portion 21a. The second recessed portion 21a and the plurality of second protruding portions 21b make the second groove portion 21 have a lattice shape.

Hereinafter, an area where the second groove portion 21 is located on the fourth surface of the second member 20 will be referred to as a "groove forming region 200".

The size of the groove forming region 200 in the second member 20 is the same as the size of the groove forming region 100 in the first member 10. The position of the groove forming region 200 on the fourth surface of the second member 20 is the same as the position of the groove forming region 100 on the third surface of the first member 10.

A heat source is arranged on the lower surface (fifth surface) located opposite to the upper surface (fourth surface) of the second member 20.

Thus, by forming each of the first groove portion 11 and the second groove portion 21 in a lattice shape, the working liquid can be efficiently circulated in the internal space of the heat dissipation member 1. Note that each of the first groove portion 11 and the second groove portion 21 need not necessarily have a lattice shape.

Figure 4:
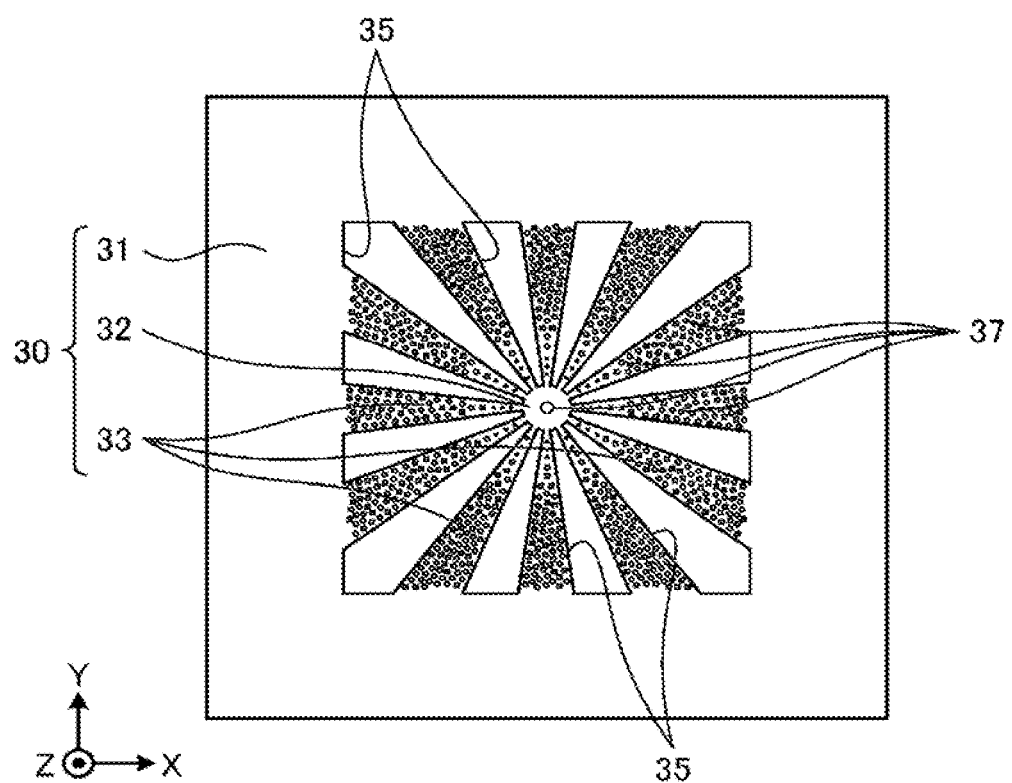
FIG. 4 is a view in which an intermediate member according to an embodiment is viewed from the Z-axis positive direction side toward the Z-axis negative direction.

The configuration of the intermediate member 30 will be described with reference to FIG. 4. FIG. 4 is a view in which an intermediate member 30 according to an embodiment is viewed from the Z-axis positive direction side toward the Z-axis negative direction.

As illustrated in FIG. 4, the intermediate member 30 includes: an edge portion 31 having a rectangular frame shape; a center portion 32 having a circular shape in plan view located inside the edge portion 31; and a plurality of connecting portions 33 located between the center portion 32 and the edge portion 31 and connecting the center portion 32 and the edge portion 31. In the example illustrated in FIG. 4, the center portion 32 is located at the center of intermediate member 30. The plurality of connecting portions 33 extend radially, widening from the center portion 32 toward the edge portion 31, at intervals from each other.

The intermediate member 30 further includes a plurality of vapor holes 35 and a plurality of through holes 37. Each of the plurality of vapor holes 35 and each of the plurality of through holes 37 penetrate the upper surface (first surface) and the lower surface (second surface) of the intermediate member 30.

The plurality of vapor holes 35 function as a part of a channel for the vapor of the working liquid. Each of the plurality of vapor holes 35 is located between two adjacent connecting portions 33. That is, each of the plurality of vapor holes 35 and each of the plurality of connecting portions 33 are alternately located in the circumferential direction. The plurality of vapor holes 35, like the plurality of connecting portions 33, extend radially, widening from the center portion 32 toward the edge portion 31 at intervals from each other.

The plurality of through holes 37 function as a part of a channel for the working liquid. Each of the through holes 37 is a fine hole having a smaller opening area than the vapor hole 35 described above. Specifically, the through hole 37 is small enough to cause a capillary phenomenon in the working liquid passing the through hole 37.

Figure 5:
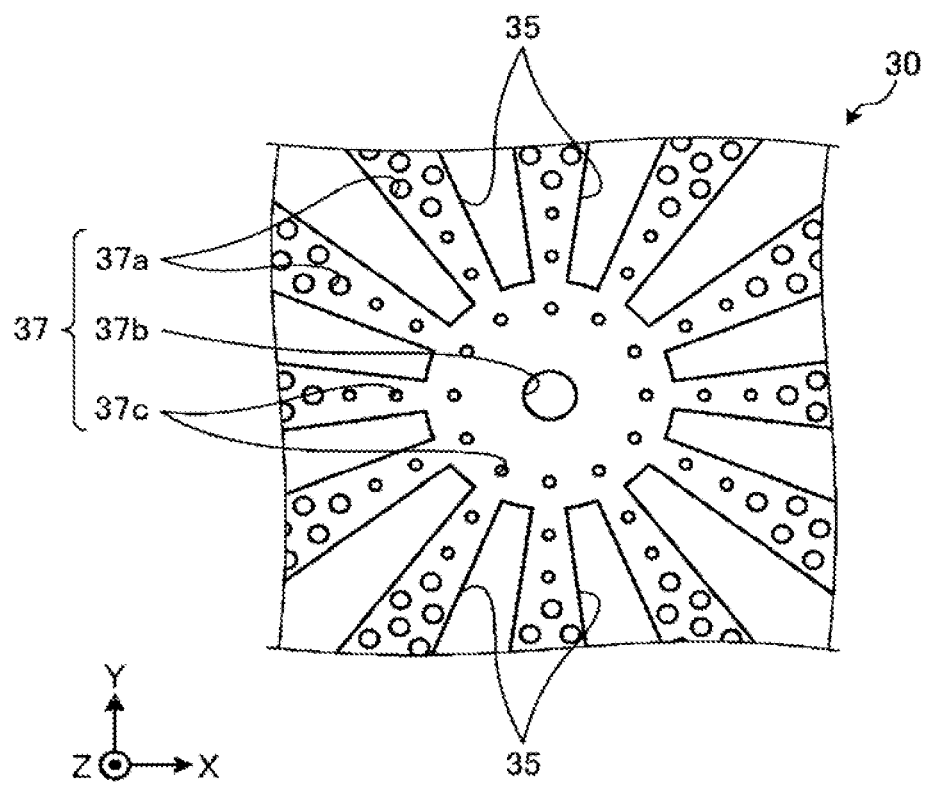
FIG. 5 is an enlarged view of the periphery of the center portion in an intermediate member 30.

The plurality of through holes 37 are located at the center portion 32 and the plurality of connecting portions 33, of the intermediate member 30. Here, a specific configuration of the plurality of through holes 37 will be described with reference to FIG. 5. FIG. 5 is an enlarged view of the periphery of the center portion 32 in the intermediate member 30.

As illustrated in FIG. 5, the plurality of through holes 37 include a plurality of types (here, three types) of through holes having different opening diameters (in other words, the opening diameter on the first member 10 side), when the intermediate member 30 is viewed from the Z-axis positive direction toward the Z-axis negative direction. Specifically, the three types are a plurality of first through holes 37a, a second through hole 37b and a plurality of third through holes 37c.

A plurality of first through holes 37a are located at each of the connecting portions 33 of the intermediate member 30. For example, the opening diameter of the first through holes 37a as viewed from the first member 10 side is, for example, from 250 μm to 700 μm.

The second through hole 37b is located at the center of the center portion 32 of the intermediate member 30. The second through hole 37b has a larger diameter than the first through hole 37a. For example, the opening diameter of the second through hole 37b as viewed from the first member 10 side is, for example, from 550 μm to 900 μm. Note that a plurality of second through holes 37b may be provided at the center portion 32.

A plurality of third through holes 37c is located at each of the connecting portions 33 of the intermediate member 30. Specifically, a plurality of third through holes 37c is located in a region within each of the connecting portions 33, near the center portion 32. A plurality of third through holes 37c is also located at the center portion 32 of the intermediate member 30. Specifically, a plurality of third through holes 37c is located on the outer peripheral portion side of the center portion 32, that is, in a region near the connecting portion 33. The third through holes 37c have a smaller diameter than the first through holes 37a. For example, the opening diameter of the third through holes 37c as viewed from the first member 10 side is, for example, from 200 to 400 μm.

Thus, the plurality of through holes 37 are located in the order of the second through hole 37b having a large opening diameter, the third through holes 37c each having a small opening diameter, and the first through holes 37a each having a medium opening diameter, advancing from the center to the outer periphery of the intermediate member 30.

Since the center portion 32 of the intermediate member 30 has a longer distance to each of the vapor holes 35 than the connecting portions 33, the circulating flow of the working liquid tends to stagnate at the center portion 32. That is, the center portion of the heat dissipation member 1 tends to be a heat spot. On the other hand, in the heat dissipation member 1 according to the embodiment, by providing the center portion 32 of the intermediate member 30 with the second through hole 37b having a large opening diameter, the vapor generated at the center portion 32 can be moved from the second through hole 37b to the low-temperature side. Thus, the circulating flow of the working liquid at the center portion of the heat dissipation member 1 can be promoted. Accordingly, the center portion of the heat dissipation member 1 can be suppressed from becoming a heat spot.

The density of the through holes 37 at the center portion 32 of the intermediate member 30 is smaller than the density of the through holes 37 at the connecting portions 33 of the intermediate member 30. In other words, when the intermediate member 30 is viewed from the Z-axis positive direction side toward the Z-axis negative direction, the ratio of the opening area of the through holes 37 (the second through hole 37b and the plurality of third through holes 37c) to the area of the center portion 32 is smaller than the ratio of the opening area of the through holes 37 (the plurality of first through holes 37a and the plurality of third through holes 37c) to the area of the connecting portions 33. Thus, by relatively reducing the density of the through holes 37 at the center portion 32, a decrease in the strength of the intermediate member 30 can be suppressed.

Figure 6:
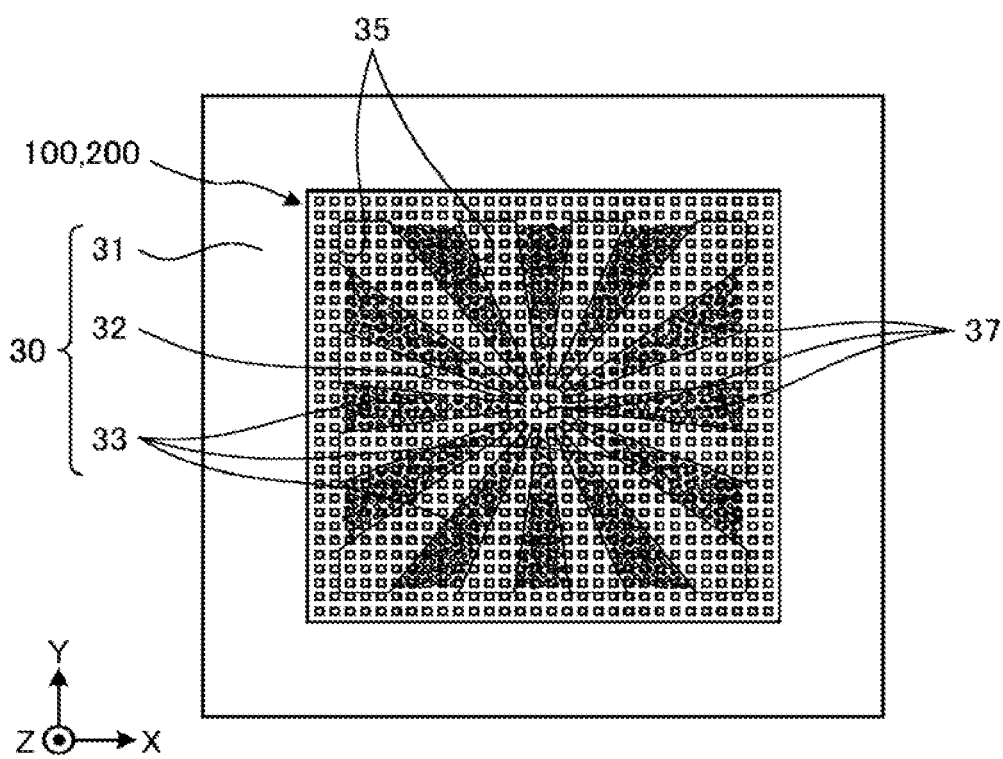
FIG. 6 is a diagram in which a groove forming region illustrated in FIG. 2 and a groove forming region illustrated in FIG. 3 are superimposed on the intermediate member illustrated in FIG. 4.

FIG. 6 is a diagram in which a groove forming region 100 illustrated in FIG. 2 and a groove forming region 200 illustrated in FIG. 3 are superimposed on the intermediate member 30 illustrated in FIG. 4.

As illustrated in FIG. 6, the groove forming regions 100 and 200 formed respectively on the first member 10 and the second member 20 overlap the edge portion 31 of the intermediate member 30. That is, the groove forming regions 100 and 200 each spread outward from the region (hereinafter referred to as "hole forming region") where the plurality of vapor holes 35 and the plurality of through holes 37 are formed in the intermediate member 30.

Thus, by making the groove forming region 100 of the first member 10 and the groove forming region 200 of the second member 20 wider than the hole forming region of the intermediate member 30, the internal space of the heat dissipation member 1 can be spread outward as compared with the case where the groove forming regions 100 and 200 are each made equal to the hole forming region.

The heat source is arranged at the center portion of the heat dissipation member 1, and the temperature of the heat dissipation member 1 becomes lower with increasing distance from the heat source, that is, approaching the outer peripheral portion of the heat dissipation member 1. The vapor of the working liquid condenses into a liquid upon moving to a low-temperature region. Accordingly, by spreading the internal space of the heat dissipation member 1 outward, condensation of the working liquid is more likely to occur. This makes it difficult for dryout to occur.

Here, an example in which the first groove forming region 110 and the second groove forming region 120 spread outward from the hole forming region of the intermediate member 30 is illustrated; however, the configuration is not limited to this, the hole forming region of the intermediate member 30 may spread outward from the first groove forming region 110 and the second groove forming region 120.

Figure 7:
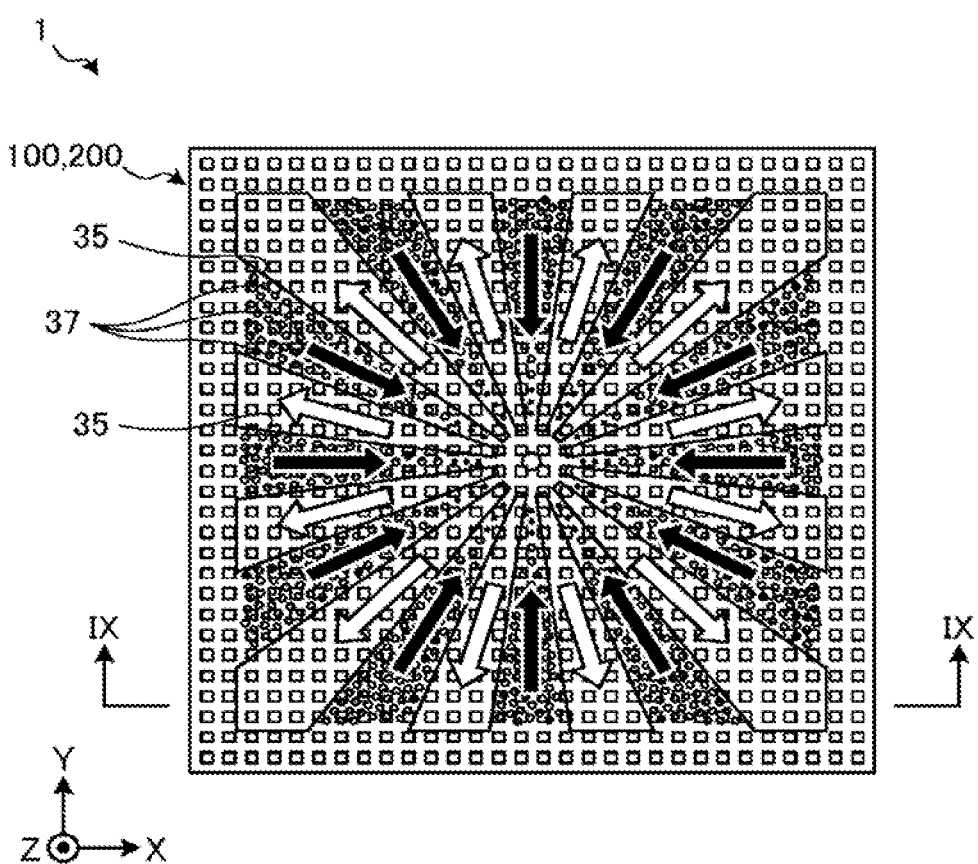
FIG. 7 is a diagram illustrating the flow of a working liquid in a heat dissipation member according to an embodiment.
Figure 8:
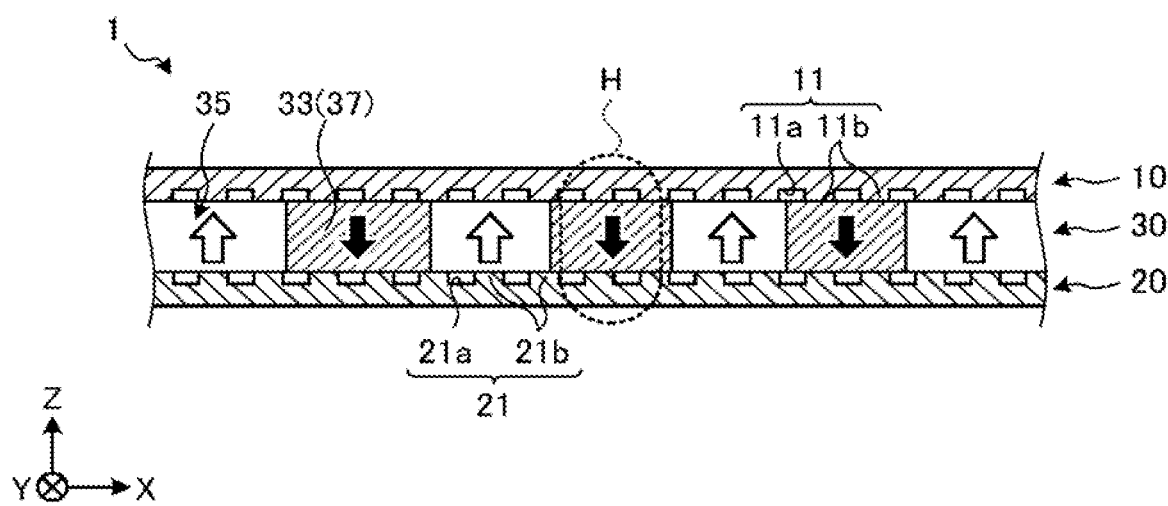
FIG. 8 is a diagram illustrating the flow of a working liquid in a heat dissipation member according to an embodiment.

Next, in the heat dissipation member 1 according to the embodiment, the flow of the working liquid will be described with reference to FIGS. 7 and 8. FIGS. 7 and 8 are diagrams illustrating the flow of the working liquid in the heat dissipation member 1 according to the embodiment. FIG. 7 is a diagram in which the edge portion 31 is omitted from the view illustrated in FIG. 6, and FIG. 8 is a cross-sectional diagram taken along an IX-IX arrow in FIG. 7. In FIGS. 7 and 8, the vapor flow is indicated by a hollow arrow and the liquid flow is indicated by a black arrow.

The working liquid is vaporized into a vapor by being heated by a heat source. As described above, the heat source is located at the center portion of the lower surface (fifth surface) of the second member 20 (see FIGS. 1 and 3). Thus, the vapor of the working liquid is generated at the center portion of the high-temperature side space (space sandwiched between the second member 20 and the intermediate member 30) where the heat source is arranged.

The vapor of the working liquid is diffused (see the hollow arrow illustrated in FIG. 7) in the in-plane direction (XY plane direction) of the heat dissipation member 1 through the groove forming region 200 (second groove portion 21), and moves (see the white arrow illustrated in FIG. 8) to the upper low-temperature-side space (space between the first member 10 and the intermediate member 30) through the plurality of vapor holes 35.

The vapor that has moved to the low-temperature-side space condenses into a liquid as the temperature decreases. The liquefied working liquid moves (see the black arrow illustrated in FIG. 7) in the groove forming region 100 (first groove portion 11) toward the center portion of the heat dissipation member 1, by the capillary force of the groove forming region 100. In this process, the working liquid enters the through holes 37 and is returned to the high-temperature-side space by the capillary force of the through holes 37 (see the black arrow in FIG. 8). By repeating the above cycle, the heat dissipation member 1 can transfer heat from the heat source.

Figure 9:
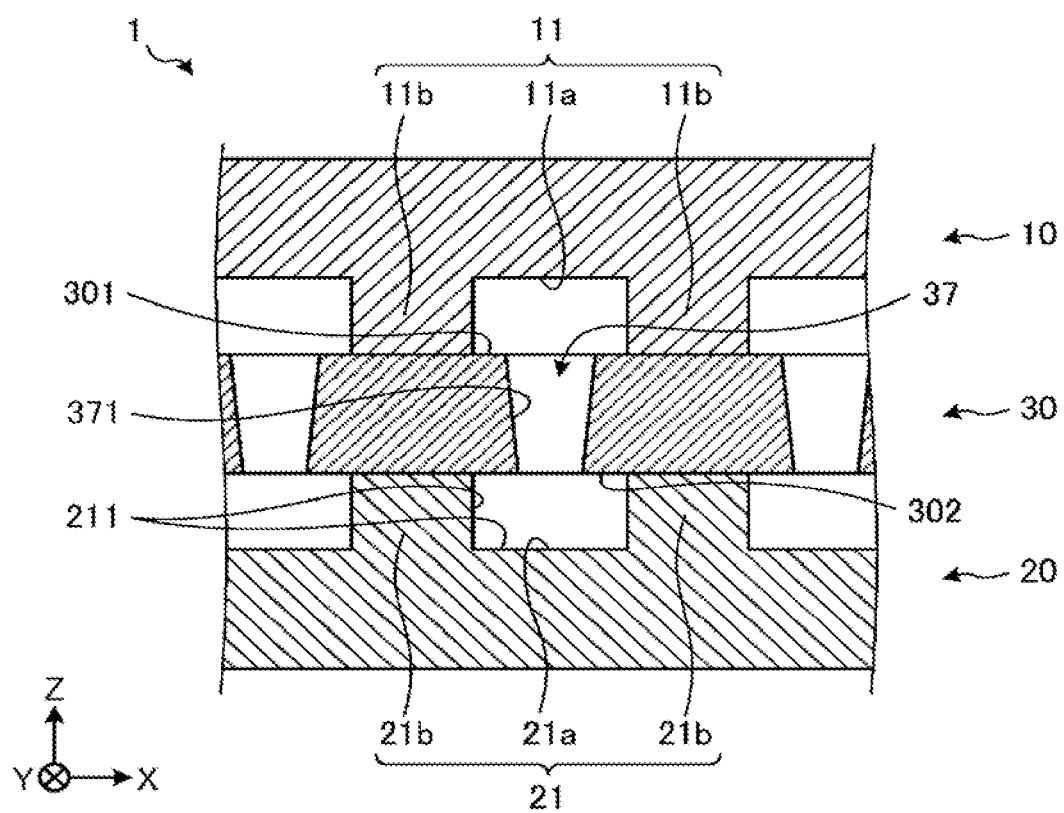
FIG. 9 is an enlarged view of an H portion illustrated in FIG. 8.

A specific configuration of the through hole 37 formed in the intermediate member 30 will be described with reference to FIG. 9. FIG. 9 is an enlarged view of the H portion illustrated in FIG. 8.

As illustrated in FIG. 9, the through hole 37 decreases in diameter from an upper surface 301 (the first surface) side, which is a low-temperature-side surface of the plate surfaces of the intermediate member 30, toward the lower surface 302 (the second surface) side, which is a high-temperature-side surface. In other words, the opening diameter of the through hole 37 narrows from the low-temperature side to the high-temperature side.

By relatively increasing the opening diameter on the low-temperature side of the through hole 37, the working liquid can easily enter the through hole 37. By relatively reducing the opening diameter on the high-temperature side of the through hole 37, the magnitude of the capillary force in the through hole 37 can be increased toward the high-temperature side. Thus, the working liquid entering the through hole 37 from the low-temperature side can be pulled to the high-temperature side at an accelerated rate by the capillary force gradually increasing.

Thus, the heat dissipation member 1, by forming the through hole 37 in a tapered shape, allows the circulation efficiency of the working liquid to be enhanced. The heat dissipation member 1, by forming the through hole 37 in a tapered shape, allows the reverse flow of the working liquid or vapor to be suppressed.

As described above, the second through hole 37b (see FIG. 5) among the plurality of through holes 37 is also used as a channel for vapor. For this reason, the second through hole 37b may be formed in a straight shape with a constant opening diameter configured to facilitate movement of the vapor.

The surface roughness of an inner surface 371 of the through hole 37 is larger than that of the upper surface 301 (the first surface) of the intermediate member 30. The greater the surface roughness, the higher the wettability. Thus, the working liquid is more likely to enter the through hole 37 having a larger surface roughness.

Thus, by making the surface roughness of the inner surface 371 of the through hole 37 larger than that of the upper surface 301 (the first surface) of the intermediate member 30, the circulation efficiency of the working liquid can be enhanced.

The surface roughness of the inner surface 211 of the second groove portion 21 is larger than that of the inner surface 371 of the through hole 37. Thus, the working liquid is easily discharged from the inside of the through hole 37 to the second groove portion 21.

Thus, by making the surface roughness of the inner surface 211 of the second groove portion 21 larger than that of the inner surface 371 of the through hole 37, the circulation efficiency of the working liquid can be enhanced.

An example of the manufacturing method of the above-mentioned heat dissipation member 1 will be described. First, respective green sheets are formed by a doctor blade method or a roll compaction method using respective materials of the first member 10, the second member 20 and the intermediate member 30. Then, by layering a plurality of the respective green sheets, a laminate is obtained.

Subsequently, the obtained laminate is subjected to laser beam machining or die punching, thereby obtaining a respective compact of the first member 10, the second member 20 and the intermediate member 30. For example, a compact of the intermediate member 30 having therein a plurality of vapor holes 35 and a plurality of through holes 37 formed can be obtained, by applying laser beam machining to the laminate. The surface roughness of the inner surface 371 of the through hole 37 can be made larger than the surface roughness of the upper surface 301 (the first surface) of the intermediate member 30 by this laser beam machining.

Respective compacts of the first member 10 and the second member 20 on which the groove forming regions 100 and 200 are formed respectively are obtained by applying laser beam machining to the obtained laminate. The surface roughness of the inner surface 211 of the second groove portion 21 can be made larger than the surface roughness of the inner surface 371 of the through hole 37 by adjusting the output of the laser in the laser beam machining.

Subsequently, respective compacts of the first member 10, the second member 20, and the intermediate member 30 are layered in the order of the second member 20, the intermediate member 30, and the first member 10, and then fired. Thus, a sintered body in which the first member 10, the second member 20, and the intermediate member 30 are integrated, is obtained. In this way, the first member 10, the second member 20 and the intermediate member 30 are integrally formed. Accordingly, since an adhesive or the like is not required, a highly reliable heat dissipation member 1 can be obtained.

Subsequently, the working liquid is injected into the sintered body from the working liquid injection hole 14 provided in the first member 10. The gas existing inside the sintered body is discharged to the outside from the gas discharge hole 15 of the first member 10 with the injection of the working liquid.

Subsequently, the working liquid injection hole 14 and the gas discharge hole 15 are closed with a respective one of sealing members 4 and 5, and an adhesive. As a result, the heat dissipation member 1 is obtained.

First Variation

Figure 10:
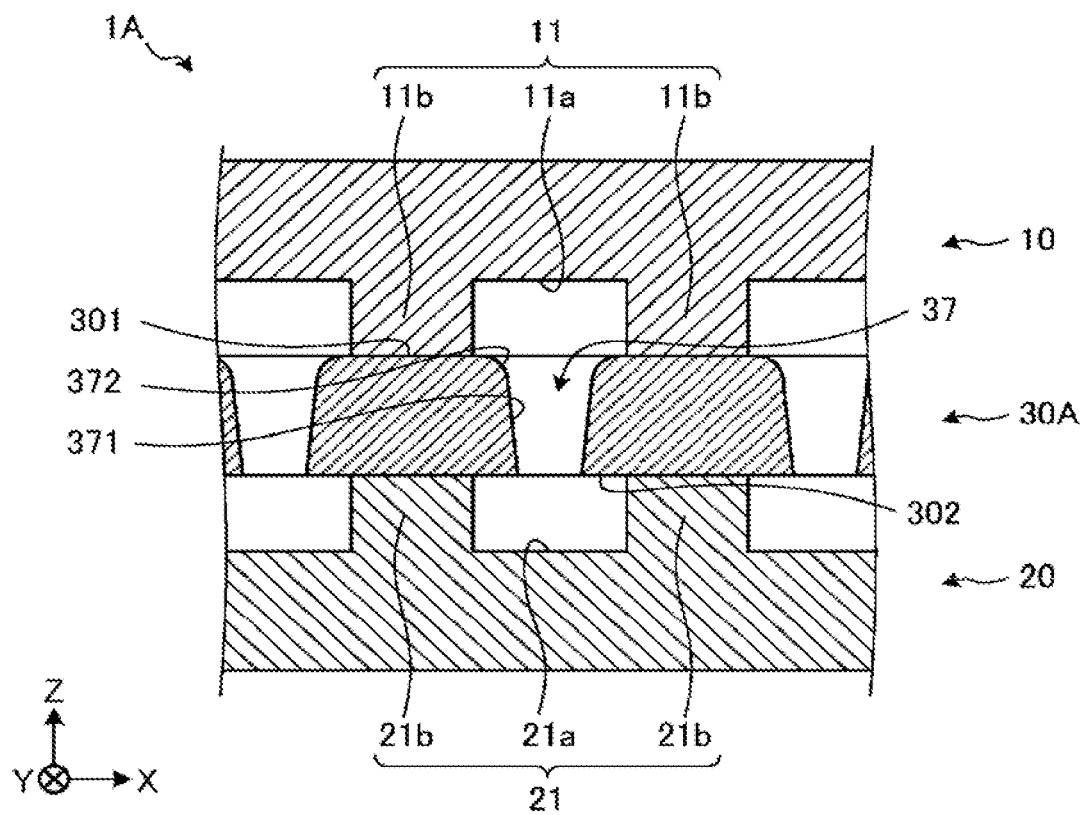
FIG. 10 is a diagram illustrating the configuration of a through hole according to a first variation.

FIG. 10 is a diagram illustrating the configuration of a through hole according to a first variation. As illustrated in FIG. 10, the heat dissipation member 1A according to the first variation includes an intermediate member 30A.

The intermediate member 30A according to the first variation includes a chamfered portion 372 between the upper surface 301 (the first surface) and the through hole 37. The chamfered portion 372 includes a curved convex surface connecting, for example, the upper surface 301 (the first surface) and the inner surface 371 of the through hole 37.

Thus, by providing the chamfered portion 372 between the upper surface 301 (the first surface) and the through hole 37, the working liquid can easily enter the through hole 37.

The chamfered portion 372 is not necessarily curved (R-shaped), but may be planar (C-shaped), for example.

When a compact of the intermediate member 30A including the chamfered portion 372 is manufactured, for example, when performing laser beam machining or die punching on a laminate of green sheets, the output of the laser beam machining or the shape of the die may be adjusted. Thereafter, the obtained compact is fired together with the first member 10 and the second member 20 to obtain a sintered body in which the first member 10, the second member 20 and the intermediate member 30A are integrated.

Second Variation

Figure 11:
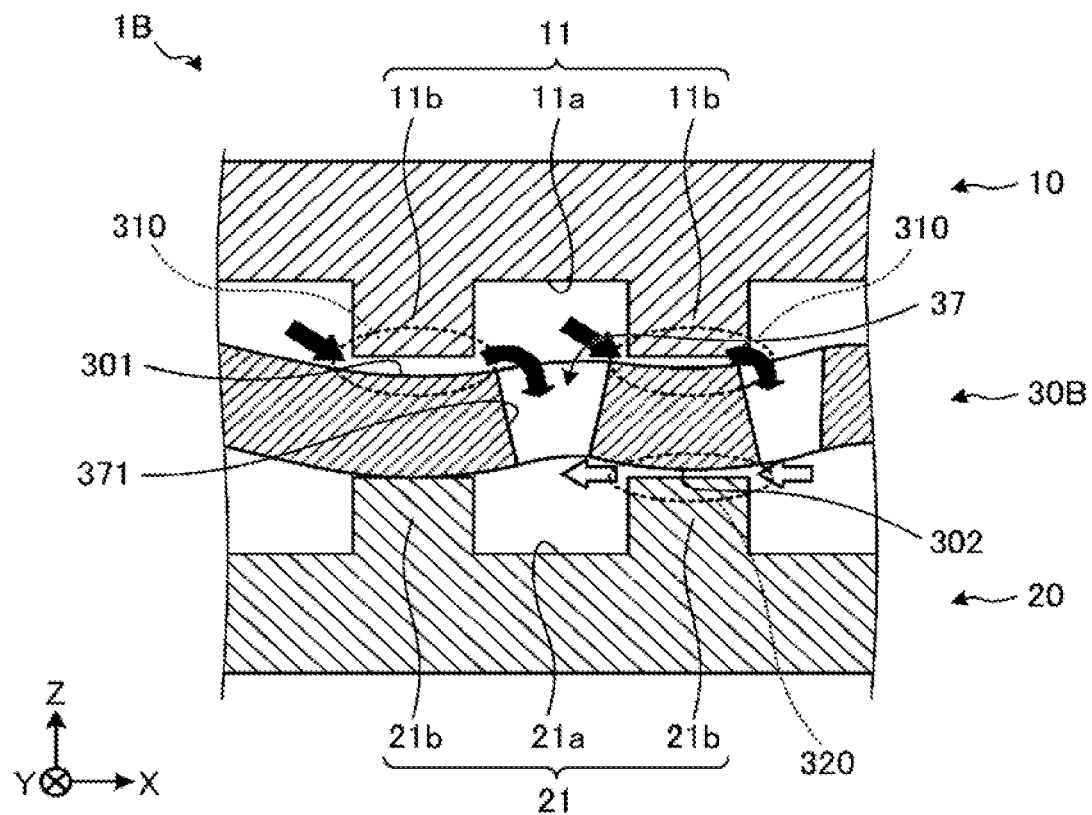
FIG. 11 is a diagram illustrating the configuration of a through hole according to a second variation.

FIG. 11 is a diagram illustrating the configuration of a through hole according to a second variation. As illustrated in FIG. 11, the heat dissipation member 1B according to the second variation includes an intermediate member 30B.

The intermediate member 30B according to the second variation is meandering with respect to the XY plane. The heat dissipation member 1B includes a first gap 310 between at least one of a plurality of first protruding portions 11$b$ of the first groove portion 11 and the upper surface 301 of the intermediate member 30B.

The heat dissipation member 1B enables the working liquid to circulate in not only the first groove portion 11 but also in the first gap 310. The working liquid is guided to the through hole 37 by capillary force in the first gap 310 and enters the through hole 37. Thus, the heat dissipation member 1B enables the circulation efficiency of the working liquid to be further enhanced by including the first gap 310.

The heat dissipation member 1B includes a second gap 320 between at least one of the plurality of second protruding portions 21$b$ of the second groove portion 21 and the lower surface 302 of the intermediate member 30B.

The heat dissipation member 1B enables the vapor of the working liquid to circulate in not only the second groove portion 21 but also in the second gap 320. Thus, the heat dissipation member 1B enables the diffusion of the vapor of the working liquid to accelerate by including the second gap 320. That is, the circulation efficiency of the working liquid can be enhanced.

When a compact of the intermediate member 30B meandering with respect to the XY plane is manufactured, for example, the pressure applied to the laminate at the time of layering the green sheets may be adjusted. For example, by applying pressure to the laminate non-uniformly, a compact of the intermediate member 30B meandering with respect to the XY plane can be obtained. Thereafter, the obtained compact is fired together with the first member 10 and the second member 20 to obtain a sintered body in which the first member 10, the second member 20 and the intermediate member 30B are integrated.

The surface roughness of the inner surface 211 of the second groove portion 21 is larger than that of the lower surface 302 (second surface) of the intermediate member 30. Thus, the working liquid is easily discharged from the lower surface 302 (second surface) of the intermediate member 30 to the second groove portion 21.

Thus, by making the surface roughness of the inner surface 211 of the second groove portion 21 larger than that of the lower surface 302 (second surface) of the intermediate member 30, the circulation efficiency of the working liquid can be enhanced.

The surface roughness of the upper surface 301 (the first surface) of the intermediate member 30, the inner surface 371 of the through hole 37, the lower surface 302 (the second surface), and the inner surface 211 of the second groove portion 21 may be adjusted within a range in which the arithmetic mean roughness Ra is, for example, from 0.08 μm to 0.4 μm, from 0.3 μm to 0.6 μm, from 0.08 μm to 0.4 μm, and from 0.5 μm to 0.8 μm, respectively.

Third Variation

Figure 12:
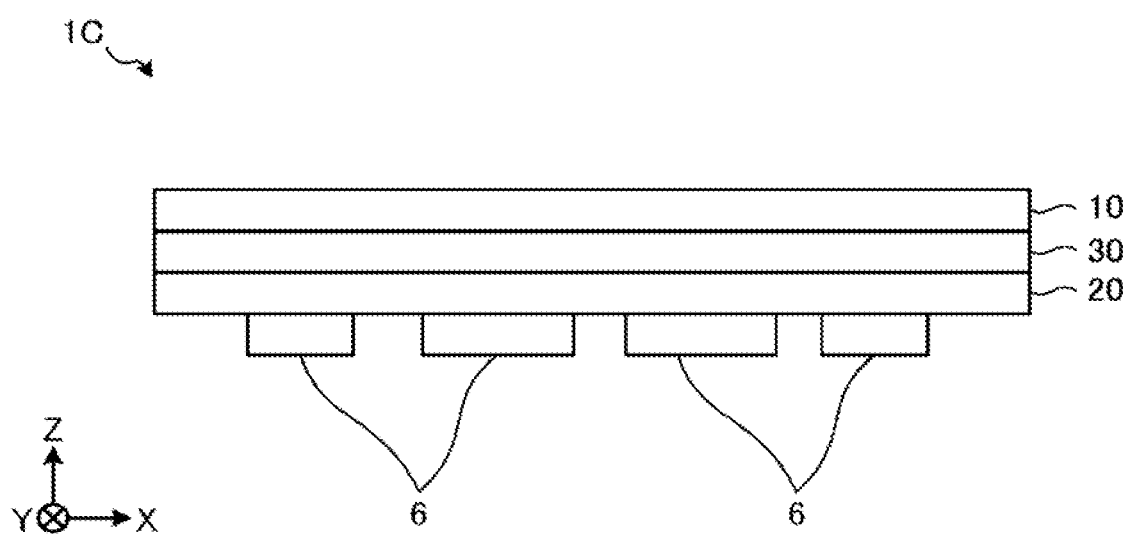
FIG. 12 is a side view of a heat dissipation member according to a third variation.

FIG. 12 is a side view of a heat dissipation member according to a third variation. As illustrated in FIG. 12, a heat dissipation member 1C may include a conductor 6 on the lower surface (the fifth surface) of the second member 20 that is on the high-temperature side.

Since the heat dissipation member itself serves as a conductor in the metal heat dissipation member, an insulator is required to be provided in order to form a circuit or the like. On the other hand, according to the heat dissipation member 1C made of a ceramic, which is an insulator, an electronic component can be directly mounted thereon by using the conductor 6 as a wiring or an electrode.

Fourth Variation

Figure 13:
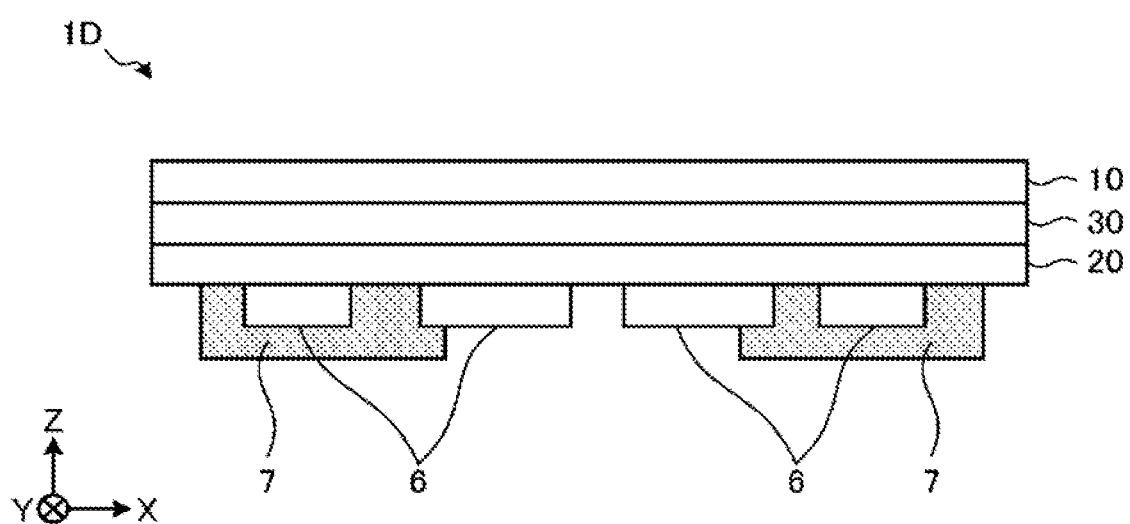
FIG. 13 is a side view of a heat dissipation member according to a fourth variation.

FIG. 13 is a side view of a heat dissipation member according to a fourth variation. As illustrated in FIG. 13, a heat dissipation member 1D may include a covering layer 7 covering at least a part of the conductor 6 on the lower surface (the fifth surface) of the second member 20 that is on the high-temperature side.

Fifth Variation

Figure 14:
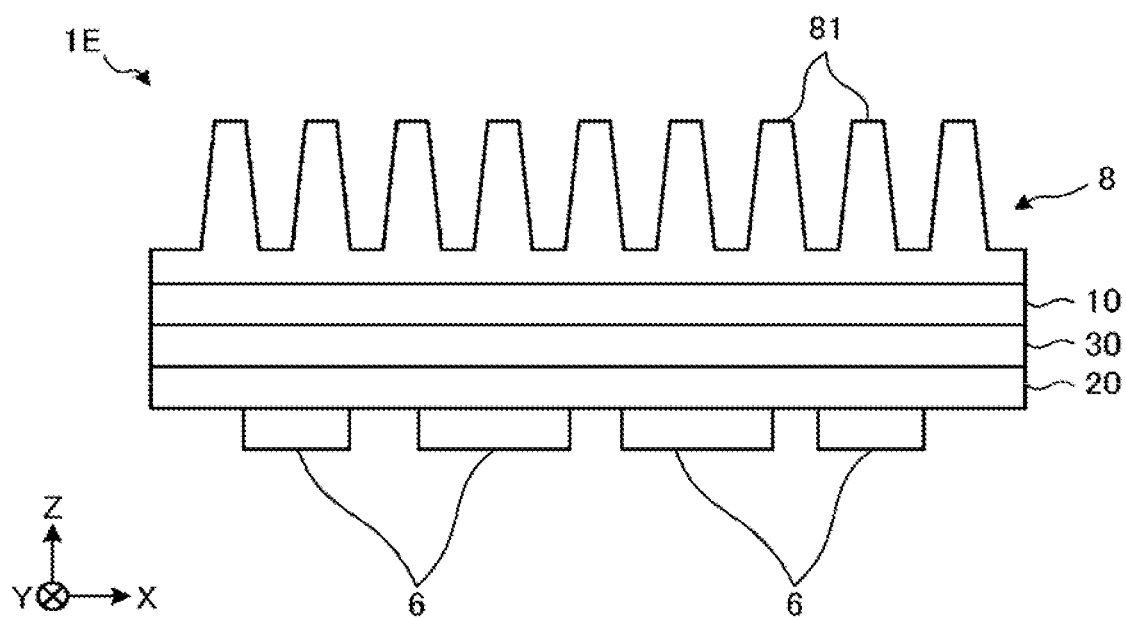
FIG. 14 is a side view of a heat dissipation member according to a fifth variation.

FIG. 14 is a side view of a heat dissipation member according to a fifth variation. As illustrated in FIG. 14, a heat dissipation member 1E may include a heat sink 8 on the upper surface (sixth surface) of the first member 10 that is on the low-temperature side. The heat sink 8 may be made of a metal or a ceramic. The heat sink 8 includes, for example, a plurality of fins 81. Thus, the heat dissipation effect can be further enhanced.

Sixth Variation

Figure 15:
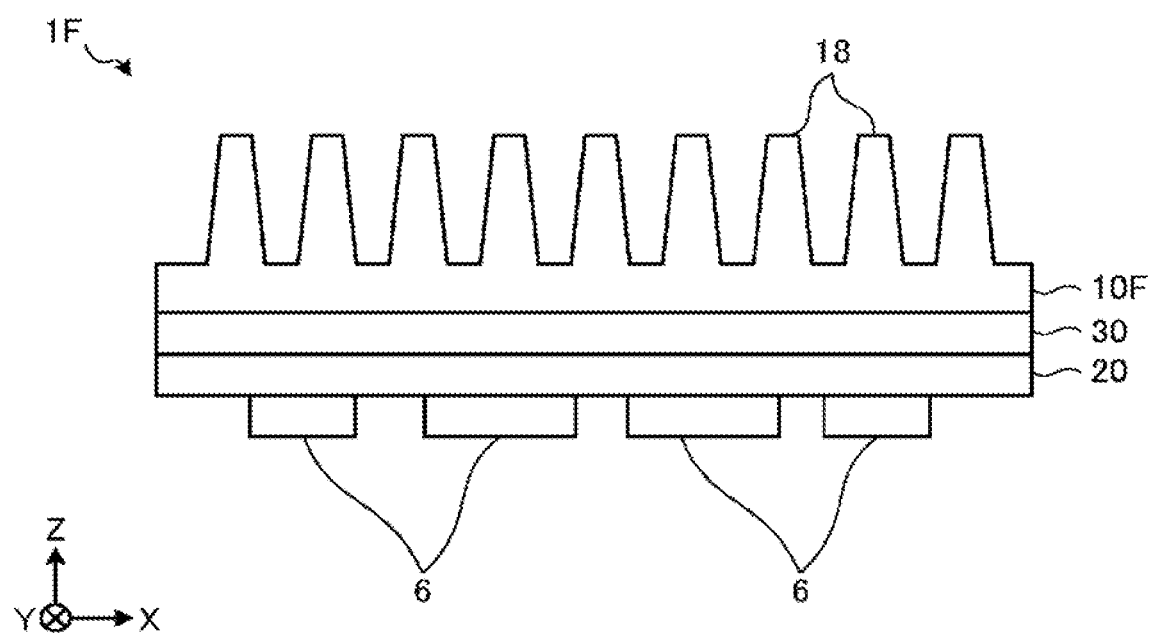
FIG. 15 is a side view of a heat dissipation member according to a sixth variation.

FIG. 15 is a side view of a heat dissipation member according to a sixth variation. As illustrated in FIG. 15, the heat dissipation member 1F may include a first member 10F in which a plurality of fins 18 made of a ceramic are integrally formed on the upper surface (the sixth surface) of the first member 10F. The first member 10F is obtained, for example, by firing a compact in which a plurality of fins 18 are formed by laser beam machining or die punching on a laminate of green sheets. According to the heat dissipation member 1F, an adhesive or the like for attaching the fin 18 is not required, so that reliability can be improved. Heat dissipation is not hindered by an adhesive or the like.

Some of the fins 18 are preferably located outside the internal space, of the heat dissipation member 1F, formed by the groove forming region 100 of the first member 10F, the groove forming region 200 of the second member 20, and the vapor holes 35 and the through holes 37 of the intermediate member 30. Thus, the heat dissipation effect can be further enhanced.

Seventh Variation

Figure 16:
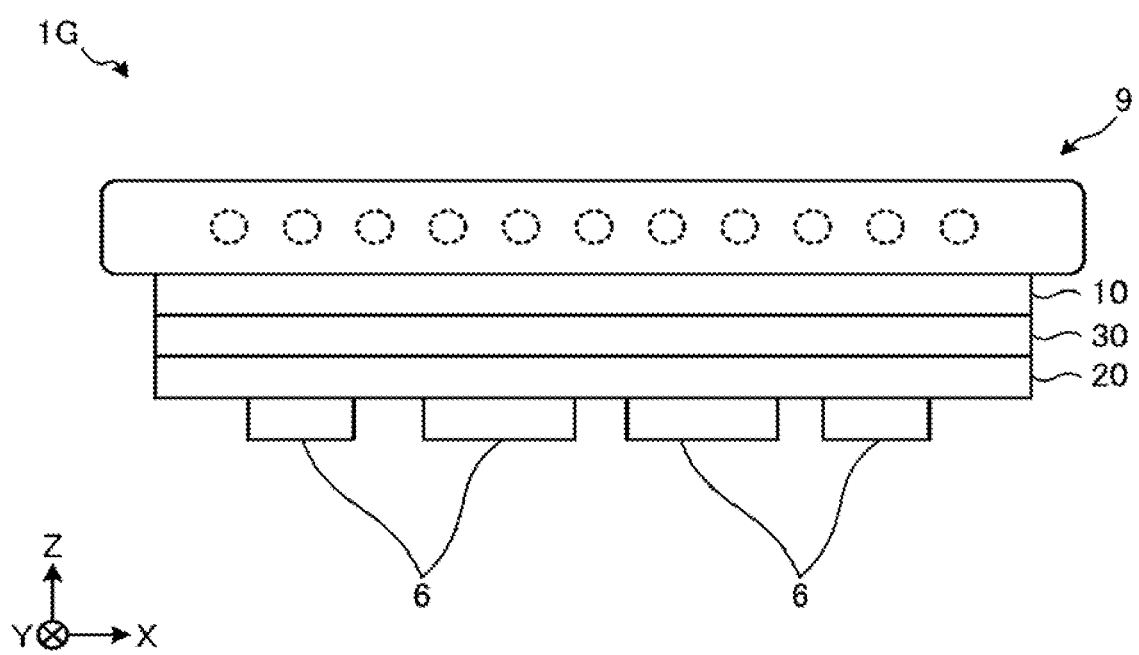
FIG. 16 is a side view of a heat dissipation member according to a seventh variation.

FIG. 16 is a side view of a heat dissipation member according to a seventh variation. As illustrated in FIG. 16, a heat dissipation member 1G may include a temperature adjusting plate 9 on the upper surface (sixth surface) of the first member 10 that is on the low-temperature side. The temperature adjusting plate 9 may be, for example, water-cooled, air-cooled, or resistance-heated.

As described above, the heat dissipation member (e.g., heat dissipation member 1, 1A to 1G) according to the embodiments includes a plate-shaped intermediate member (e.g., intermediate member 30, 30A, 30B), a first member (e.g., first member 10, 10F) and a second member (e.g., second member 20), made of a ceramic. The intermediate member includes a plurality of through holes (e.g., through hole 37) each penetrating through the first surface (e.g., upper surface 301) and the second surface (e.g., lower surface 302), of the intermediate member, located on opposite sides to each other. The first member includes a first groove portion (e.g., first groove portion 11) on a third surface (e.g., lower surface) facing the first surface of the intermediate member. The second member includes a plurality of second groove portions (e.g., the second groove portion 21) on a fourth surface (e.g., upper surface) facing the second surface of the intermediate member, and a heat source is arranged on a fifth surface (e.g., lower surface) located opposite to the fourth surface. In the intermediate member, the surface roughness of the inner surface of the through hole is larger than that of the first surface. As a result, the working liquid easily enters the inside of the through hole, so that the circulation efficiency of the working liquid can be enhanced. Thus, the heat dissipation efficiency can be further improved.

The first groove portion and the second groove portion are lattice-shaped. Thus, the working liquid can be efficiently circulated in the internal space of the heat dissipation member.

The surface roughness of the inner surface of the second groove portion is larger than that of the inner surface of the through hole. Thereby, the working liquid is easily discharged from the inside of the through hole to the second groove portion, so that the circulation efficiency of the working liquid can be enhanced.

The first groove portion includes a first recessed portion (e.g., first recessed portion 11a) recessed with respect to the third surface and a plurality of first protruding portions (the first protruding portions 11b) located in the first recessed portion. The heat dissipation member according to the embodiment includes a gap (e.g., first gap 310) between at least one of the plurality of first protruding portions and the first surface. Thus, the working liquid flows not only in the first groove portion but also in the gap, so that the circulation efficiency of the working liquid can be enhanced.

The second groove portion includes a second recessed portion (e.g., the second recessed portion 21a) recessed with respect to the fourth surface and a plurality of second protruding portions (e.g., the second protruding portions 21b) located in the second recessed portion. The heat dissipation member according to the embodiment includes a gap (e.g., second gap 320) between at least one of the plurality of second protruding portions and the second surface. Thus, the working liquid flows not only in the second groove portion but also in the gap, so that the circulation efficiency of the working liquid can be enhanced.

The intermediate member includes an edge portion (e.g., edge portion 31), a center portion (e.g., center portion 32), and a plurality of connecting portions (e.g., connecting portions 33) located between the center portion and the edge portion and connecting the center portion and the edge portion. The plurality of through holes includes a plurality of first through holes (e.g., first through holes 37a) located at a connecting portion and at least one second through hole (e.g., second through hole 37b) located at a center portion and having an opening area larger than that of the first through hole. By providing a second through hole having a large opening diameter at the center portion of the intermediate member, the center portion of the heat dissipation member can be suppressed from becoming a heat spot.

In plan view, the first groove portion and the second groove portion overlap the edge portion. By spreading the internal space of the heat dissipation member outward, condensation of the working liquid tends to occur, and thus the dryout hardly occurs.

Each of the plurality of through holes decreases in diameter from the first surface side toward the second surface side. By relatively increasing the opening diameter on the low-temperature side, the working liquid can easily enter the through hole. By relatively reducing the opening diameter on the high-temperature side, the magnitude of the capillary force in the through hole can be increased toward the high-temperature side. Thus, the circulation efficiency of the working liquid can be enhanced. That is, the heat dissipation efficiency can be further improved.

The intermediate member includes a chamfered portion (e.g., chamfered portion 372) between the first surface and the through hole. Thus, the working liquid can easily enter the through hole.

Note that although the above-described embodiments and variations have been described with respect to an example in which the shape of the through hole is a shape (tapered shape) in which the through hole decreases in diameter from the first surface side toward the second surface side of the intermediate member, the shape of the through hole is not limited to a tapered shape. For example, the shape of the through hole may be a shape (reverse taper shape) in which the through hole spreads in diameter from the first surface side to the second surface side of the intermediate member. The shape of the through hole may be a shape (straight shape) in which the through hole is substantially constant in diameter from the first surface side to the second surface side of the intermediate member.

Note that the embodiment disclosed herein is exemplary in all respects and not restrictive. Indeed, the embodiments described above may be embodied in a variety of forms. The above-described embodiments may be omitted, substituted or modified in various forms without departing from the scope and spirit of the appended claims.

REFERENCE SIGNS

1 Heat dissipation member
4, 5 Sealing member
6 Conductor
7 Covering layer
8 Heat sink
9 Temperature adjusting plate
10 First member
11 First groove portion
11a First recessed portion
11b First protruding portion
14 Working liquid injection hole
15 Gas discharge hole
20 Second member
21 Second groove portion
21a Second recessed portion
21b Second protruding portion
30 Intermediate member
31 Edge portion
32 Center portion
33 Connecting portion
35 Vapor hole
37 Through hole
37a First through hole
37b Second through hole
37c Third through hole
100 Groove forming region
200 Groove forming region

The invention claimed is:

1. A heat dissipation member comprising:
an intermediate member with a plate shape made of a ceramic and comprising a plurality of through holes, each of the plurality of through holes penetrating through a first surface and a second surface of the intermediate member, located opposite to each other;
a first member with a plate shape made of a ceramic and comprising a first groove portion on a third surface facing the first surface of the intermediate member; and
a second member with a plate shape made of a ceramic and comprising a plurality of second groove portions on a fourth surface facing the second surface of the intermediate member, wherein
a surface roughness of an inner surface of each of the plurality of second groove portions is larger than a surface roughness of an inner surface of each of the plurality of through holes in the intermediate member.

2. The heat dissipation member according to claim 1, wherein
the intermediate member has a surface roughness of an inner surface of each of the plurality of through holes larger than a surface roughness of the first surface.

3. The heat dissipation member according to claim 1, wherein
each of the plurality of through holes decreases in diameter from the first surface side toward the second surface side.

4. The heat dissipation member according to claim 1, wherein
a surface roughness of the inner surface of each of the plurality of second groove portions is larger than a surface roughness of the second surface of the intermediate member.

5. The heat dissipation member according to claim 1, wherein
the first groove portion and the plurality of second groove portions are respectively lattice-shaped.

6. The heat dissipation member according to claim 1, wherein
the intermediate member comprises at least one chamfered portion between the first surface and the plurality of through holes.

7. The heat dissipation member according to claim 1, wherein
the first groove portion comprises a first recessed portion recessed with respect to the third surface and a plurality of first protruding portions located within the first recessed portion, and
a gap is provided between at least one of the plurality of first protruding portions and the first surface.

8. The heat dissipation member according to claim 1, wherein
at least one of the second groove portions comprises a second recessed portion recessed with respect to the fourth surface and a plurality of second protruding portions located within the second recessed portion, and a gap is provided between at least one of the plurality of second protruding portions and the second surface.

9. The heat dissipation member according to claim 1, wherein the intermediate member comprises an edge portion, a center portion, and a plurality of connecting portions located between the center portion and the edge portion and connecting the center portion and the edge portion, and the plurality of through holes comprises:
  a plurality of first through holes located at the plurality of connecting portions; and
  at least one second through hole located at the center portion, each of the at least one second through hole having an opening area larger than each of the plurality of first through holes.

10. The heat dissipation member according to claim 9, wherein the density of the at least one second through hole at the center portion is smaller than the density of the plurality of first through holes at the plurality of connecting portions.

11. The heat dissipation member according to claim 1, wherein the intermediate member comprises an edge portion, a center portion, and a plurality of connecting portions located between the center portion and the edge portion and connecting the center portion and the edge portion, and the first groove portion and the plurality of second groove portions each overlap the edge portion in plan view.

* * * * *